(12) United States Patent
Walls

(10) Patent No.: US 7,924,131 B2
(45) Date of Patent: Apr. 12, 2011

(54) ELECTRICAL COMPONENT HAVING AN INDUCTOR AND A METHOD OF FORMATION

(75) Inventor: James A. Walls, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 973 days.

(21) Appl. No.: 11/437,073

(22) Filed: May 19, 2006

(65) Prior Publication Data

US 2007/0268105 A1 Nov. 22, 2007

(51) Int. Cl.
*H01F 5/00* (2006.01)
(52) U.S. Cl. ...................................... 336/200
(58) Field of Classification Search .............. 336/65, 336/83, 200, 205–208, 232; 257/531
See application file for complete search history.

(56) References Cited

U.S. PATENT DOCUMENTS

| | | | |
|---|---|---|---|
| 4,202,007 A * | 5/1980 | Dougherty et al. ............ 257/697 |
| 5,372,967 A | 12/1994 | Sundaram et al. |
| 5,576,680 A | 11/1996 | Ling |
| 5,884,990 A | 3/1999 | Burghartz et al. |
| 5,936,298 A | 8/1999 | Capocelli et al. |
| 6,611,188 B2 | 8/2003 | Yeo et al. |
| 6,800,533 B1 | 10/2004 | Yeo et al. |
| 6,833,781 B1 * | 12/2004 | Padmanabhan et al. ...... 336/200 |
| 6,908,784 B1 * | 6/2005 | Farnworth et al. ............ 438/106 |
| 6,922,127 B2 | 7/2005 | Zou et al. |

OTHER PUBLICATIONS

Jian Sun; Mehrotra, V.; "Orthogonal Winding Structures and Design for Planar Integrated Magnetics"; APEC 2004. Nineteenth Annual IEEE Applied Power Electronics Conference and Exposition (IEEE Cat. No. 04CH37520); p. 933-8, vol. 2 2004. *Traditional Wire Would Inductor.*
Dahlmann, G.W.; Yeatman, E.M.; Young, P.; Robertson, I.D.; Lucyszyn, S.; "Fabrication, RF Characteristics and Mechanical Stability of Self-Assembled 3D Microwave Inductors"; Sensors and Actuators A (Physical) vol. A97-98, p. 215-20, Apr. 1, 2002. *Involves Peeling and Erecting Inductor Out-of-Plane.*

* cited by examiner

*Primary Examiner* — Tuyen Nguyen
(74) *Attorney, Agent, or Firm* — Daniel D. Hill

(57) ABSTRACT

An electrical component (100) having an inductor includes: (a) a first substrate (102) comprising at least one first electrically conductive layer (108, 110, 112); (b) one or more second substrates (104, 106) comprising at least one second electrically conductive layer (120, 132, 144); and (c) one or more electrical interconnections (124, 134, 142) electrically coupling the at least one first electrically conductive layer and the at least one second electrically conductive layer, wherein the one or more first electrically conductive layers, the one or more second electrically conductive layers and the one or more electrical interconnections are electrically coupled together to form the inductor (150).

10 Claims, 6 Drawing Sheets

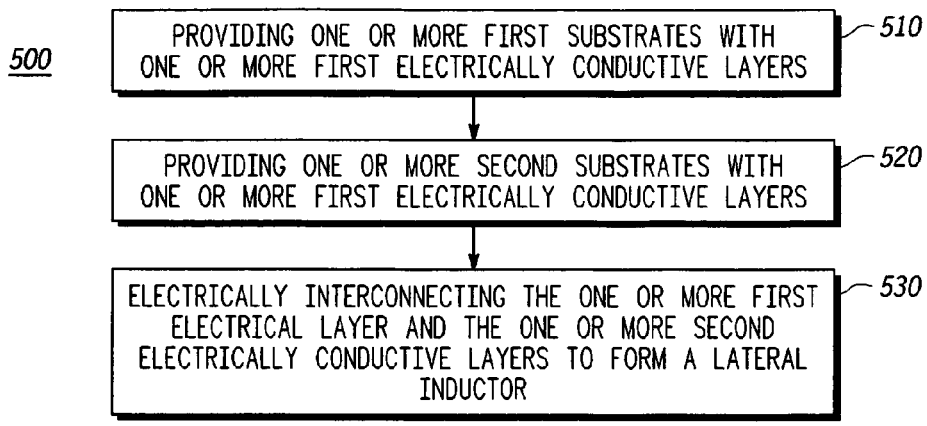
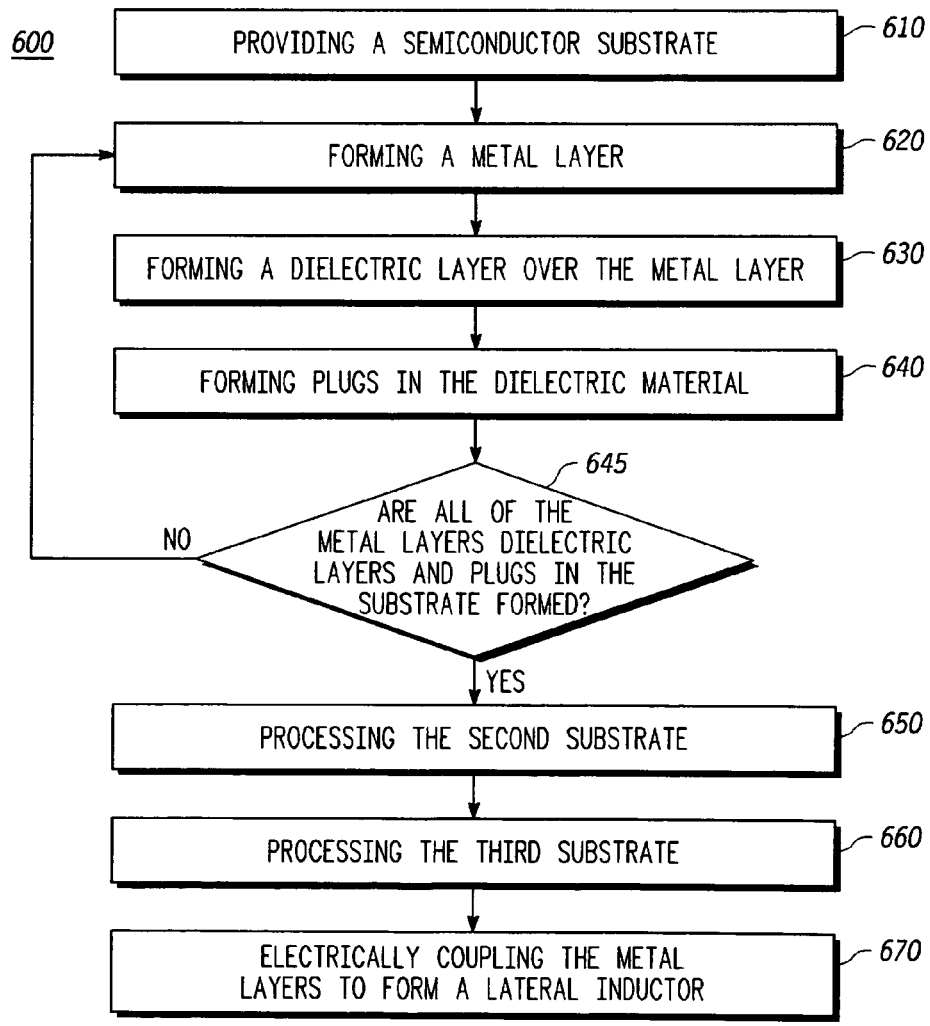

ELECTRICAL COMPONENT HAVING AN INDUCTOR AND A METHOD OF FORMATION

FIELD OF THE INVENTION

This invention relates, in general, to electronics and more particularly to electronic devices having inductors and a method of formation.

BACKGROUND OF THE INVENTION

It is known in the semiconductor arts to fabricate inductors using thin film structures. Metal thin film inductors generally are formed in spiral or rectangular snake patterns across a surface of a semiconductor substrate.

Conventional spiral inductors have many problems. One of the features inherent in an integrated circuit having an inductor is the need for large areas or volumes in order to produce acceptable inductance values. The inductance value (Q) which can be achieved by a given inductor is a function of its length and the number of turns or coils which can be fabricated in the structure. Horizontal inductors become large very rapidly as the length and number of turns increases, and thus large inductance values cannot be achieved using horizontal or planar structures. Furthermore, existing planar embedded inductors suffer from low Q values, high series resistance, substrate coupling, and deleterious resonant contributions from cladding and/or barrier layers in damascene interconnections.

Accordingly, a need exists for an inductor with minimal horizontal surface area and a high inductance, which can be manufactured using conventional methods.

BRIEF DESCRIPTION OF THE DRAWINGS

The invention will be better understood from a reading of the following detailed description, taken in conjunction with the accompanying figures in the drawings in which:

FIG. 6 illustrates a first flow chart for a method of forming an inductor in accordance with an embodiment of the invention.

FIG. 7 illustrates a second flow chart for a method of manufacturing an inductor in accordance with an embodiment of the invention.

Figure 1:
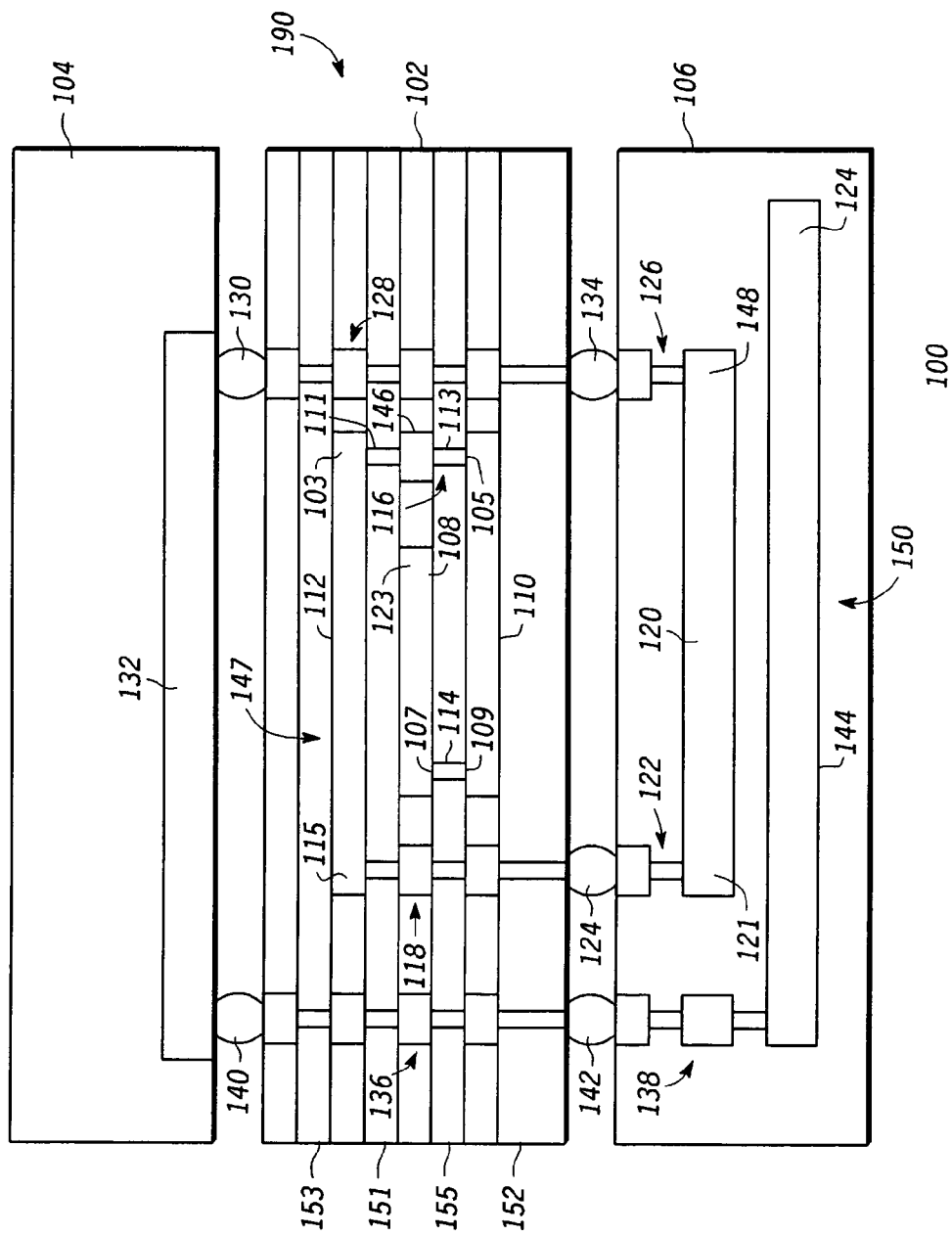
FIG. 1 illustrates cross-sectional view of a first electrical component having an inductor in accordance with a first embodiment of the present invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly coupled in an electrical or non-electrical manner.

DETAILED DESCRIPTION OF THE INVENTION

In an embodiment of the invention, an electrical component having an inductor includes: (a) a first substrate comprising at least one first electrically conductive layer; (b) one or more second substrates comprising at least one second electrically conductive layer; and (c) one or more electrical interconnections electrically coupling the at least one first electrically conductive layer and the at least one second electrically conductive layer, wherein the one or more first electrically conductive layers, the one or more second electrically conductive layers, and the one or more electrical interconnections are electrically coupled together to form the inductor.

In another embodiment of the invention, an inductor in a electrical component is formed by the steps of: (a) providing one or more first substrates comprising one or more first electrically conductive layers; (b) providing one or more second substrates comprising one or more second electrically conductive layers; and (c) electrically interconnecting the first electrically conductive layers and the second electrically conductive layers to form the inductor.

FIG. 1 illustrates cross-sectional view of an electrical component 100 in accordance with a first embodiment of the present invention. It should be understood that inductor 100 is merely exemplary and that the present invention may be employed in many different structures not specifically depicted herein.

As an example, electrical component 100, shown in FIG. 1, uses a multi-layer interconnect structure with both die and packaging substrates in a stacked or multi-layer assembly to maximize the number of turns for increased inductance in an inductor 190. Electrical component 100 comprises three substrates 102, 104, and 106 in this embodiment. Preferably, substrate 102 is a high density interconnect (HDI) substrate, and substrates 104 and 106 are comprised of silicon (Si), gallium arsenite (GaAs), germanium (Ge) or any semiconductor material suitable for a given electrical component implementation. However, substrates 102, 104, and 106 can be any combination of HDI substrates, semiconductor substrates, and other substrates such as printed circuit boards (PCBs).

As an example, an HDI substrate can be a substrate or a printed board with a higher wiring density per unit area than conventional PCBs. Usually, HDI substrates are defined as substrates that use plugs with diameters of eighty microns or less. HDI substrates have finer lines and spaces, smaller vias and capture pads, and higher connection pad density than employed in conventional PCB technology. HDI substrates are used to reduce size and weight, as well as to enhance electrical performance.

Substrate 102 comprises a plurality of electrically conductive layers 108, 110, and 112 and vias 114, 116, 118, 128, and 136. Via 114 electrically couples an end 107 of the innermost layer, i.e., layer 108, to an end 109 of layer 110. An end 105 of the layer 110 is electrically coupled to an end 103 of layer 112 by via 116. Coupling the ends of layers 108, 110, and 112 in this manner forms a vertical spiral 147 in substrate 102.

Similarly, substrate 104 comprises an electrically conductive layer 132, and substrate 106 comprises electrically conductive layers 120 and 144 and vias 122, 126, and 138. Electrical interconnections 124, 134, and 142 are located between substrates 102 and 106, and electrical interconnections 130 and 140 are located between substrates 102 and 104.

Any of the substrates 102, 104, and 106 can also include one or more dielectric layers between different metal layers. As an example, substrate 102 comprises dielectric layers 155, 151, 152, and 153. In substrate 102, dielectric layer 155 is located between layers 108 and 110. In general, dielectric layers 155, 151, 152, and 153 separate the metal layers in substrate 102. As an example, layers 155, 151, 152, and 153 comprises silicon dioxide ($SiO_2$). In other embodiments, layers 155, 151, 152, and 153 comprise other low-k dielectric materials.

As used herein, vias are electrical interconnections that include both the portions of intermediate metal layers and the metal-filled holes in the dielectric layers between the intermediate metal layers, i.e., plugs. As an example, via 116 comprises an electrically conductive layer 146 and electrically conductive plugs 111 and 113 formed in dielectric layers 155 and 151, respectively. Plugs 111 and 113 are formed by creating holes in dielectric layers 155 and 151 and depositing a metal therein. In one embodiment, the plugs are formed of tungsten (W). In another embodiment, the plugs can be copper. One skilled in the art will understand that layers 108 and 116 in some embodiments can be formed simultaneously with each other.

Spiral 147 can be lengthened by electrically coupling an end 115 of layer 112 to an end 121 of an electrically conductive layer 120 in substrate 106. Extending inductor 190 into multiple substrates in the vertical direction allows the density of inductor 100 to be increased while conserving horizontal surface area across substrates 102, 104, and 106.

The layers 112 and 120 are electrically coupled together by via 118 in substrate 102 and a via 122 in substrate 106, and an electrical interconnection 124 located between substrates 102 and 106. The electrical interconnections can be solder bumps, flip chip bumps, or any direct connection mechanism, such as the mechanisms described in U.S. Pat. No. 6,838,776 to Leal et al. and U.S. Pat. No. 6,921,975 to Leal et al.

An end 148 of layer 120 is electrically coupled to electrically conductive layer 132 in substrate 104 through vias 126 and 128 and electrical interconnections 130 and 134. Similarly, vias 136 and 138 and electrical interconnections 140 and 142 electrically couple layer 132 in substrate 104 to electrically conductive layer 144 in substrate 106. A vertical spiral 150 created by this multi-layer interconnection structure forms inductor 190. (Vertical spiral 147 is part of vertical spiral 150.) An end 123 of layer 108 and an end 124 of layer 144 form the input/output (I/O) connections for inductor 190.

Layers 108, 110, 112, 120, 132, and 144 can comprise one or more metals. Different electrically conductive layers can be comprised of different metals. As an example, layer 108 can comprise a first metal, and layer 110 can comprise a second metal. Preferably, the electrically conductive layers in a HDI substrate are copper; the electrically conductive layers in a silicon substrate comprise copper or aluminum; and electrically conductive layers in a GaAs substrate comprise gold.

Figure 2:
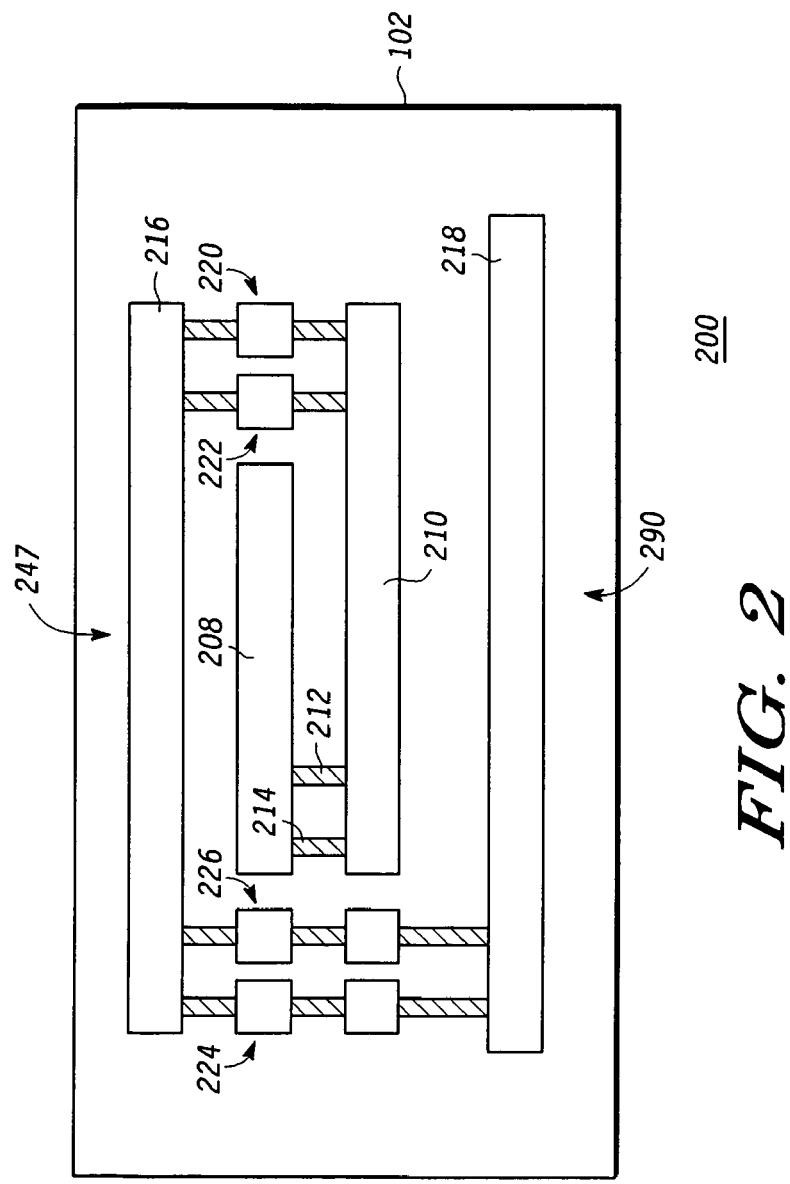
FIG. 2 illustrates cross-sectional view of a second electrical component having an inductor in accordance with a second embodiment of the present invention.

FIG. 2 illustrates cross-sectional view of an electrical component 200 having an inductor 290 in accordance with a second embodiment of the present invention. In this embodiment, electrical component 200 comprises a single substrate 102 with electrically conductive layers 208, 210, 216, and 218 coupled by multiple vias.

As an example, inductor 290 comprises a vertical spiral 247 having layers 208 and 210 and vias 212 and 214 formed in a substrate 102. Two vias 212 and 214 electrically couple layer 208 to layer 210. Likewise, layer 210 is electrically coupled to layer 216 by two vias 220 and 222, and layer 216 is electrically coupled to layer 218 by two vias 224 and 226. Use of multiple vias to couple two electrically conductive layers lowers the series resistance in inductor 290 and thus increases the Q value of inductor 290.

Figure 3:
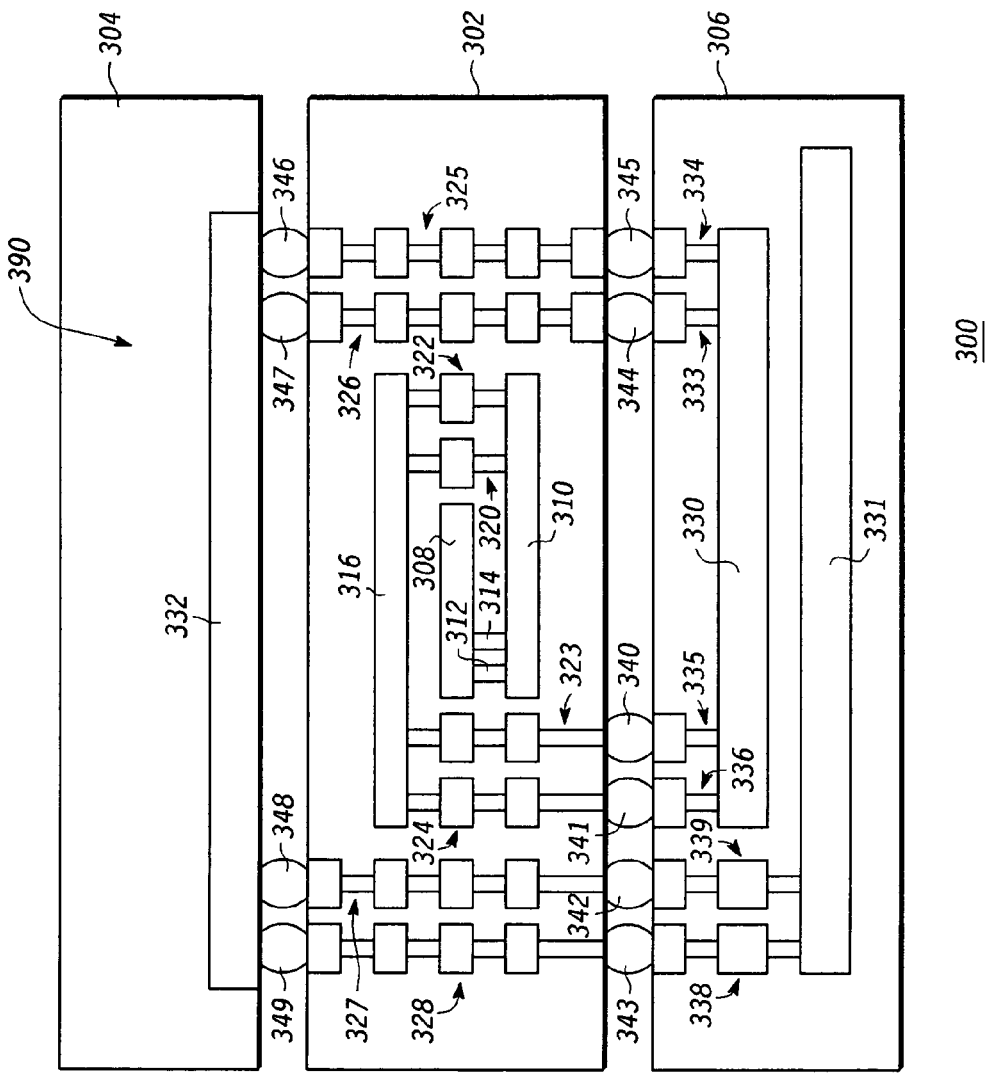
FIG. 3 illustrates cross-sectional view of a third electrical component having an inductor in accordance with a third embodiment of the present invention.

FIG. 3 illustrates cross-sectional view of an electrical component 300 having an inductor 390 in accordance with a third embodiment of the present invention. In this embodiment, electrical component 300 comprises substrates 302, 304, and 306 with the electrically conductive layers 308, 310, 316, 330, 331, and 332 coupled by multiple vias and electrical interconnections.

Substrate 302 comprises a plurality of electrically conductive layers 308, 310, and 316 and vias 312, 314, 320, 322, 323, 324, 325, 326, 327, and 328. Similarly, substrate 304 comprises an electrically conductive layer 332, and substrate 306 comprises electrically conductive layers 330 and 331 and vias 333, 334, 335, 336, 338, 339, and 339. Electrical interconnections 340, 341, 342, 343, 344 and 345 are located between substrates 302 and 306, and electrical interconnections 346, 347, 348, and 349 are located between substrates 302 and 304.

As an example, in electrical component 300 of FIG. 3, two vias 312 and 314 electrically couple layer 308 to layer 310. Likewise, layer 310 is electrically coupled to layer 316 by two vias 320 and 322.

Layer 316 is electrically coupled to layer 330 by vias 323, 324, 335, and 336 and also by electrical interconnections 340 and 341. Similarly, layer 330 is electrically coupled to layer 332 by vias 325, 326, 333, and 334 and also by electrical interconnections 344, 345, 346, and 347. Layer 332 is electrically coupled to layer 331 by vias 327, 328, 338, and 339 and also by electrical interconnections 343, 344, 348, and 349.

Figure 4:
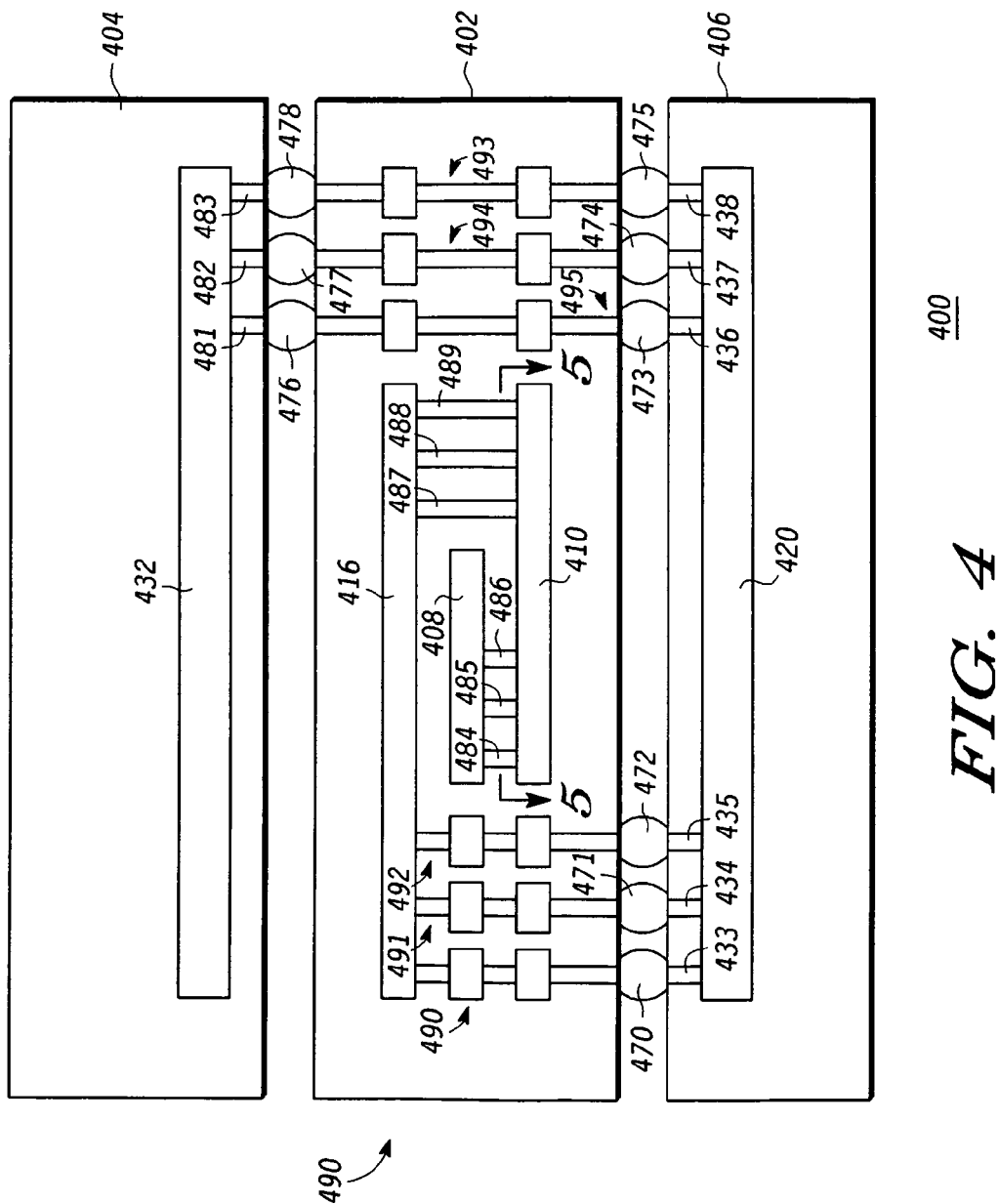
FIG. 4 illustrates a cross-sectional view of a fourth electrical component having an inductor in accordance with a fourth embodiment of the present invention.
Figure 5:
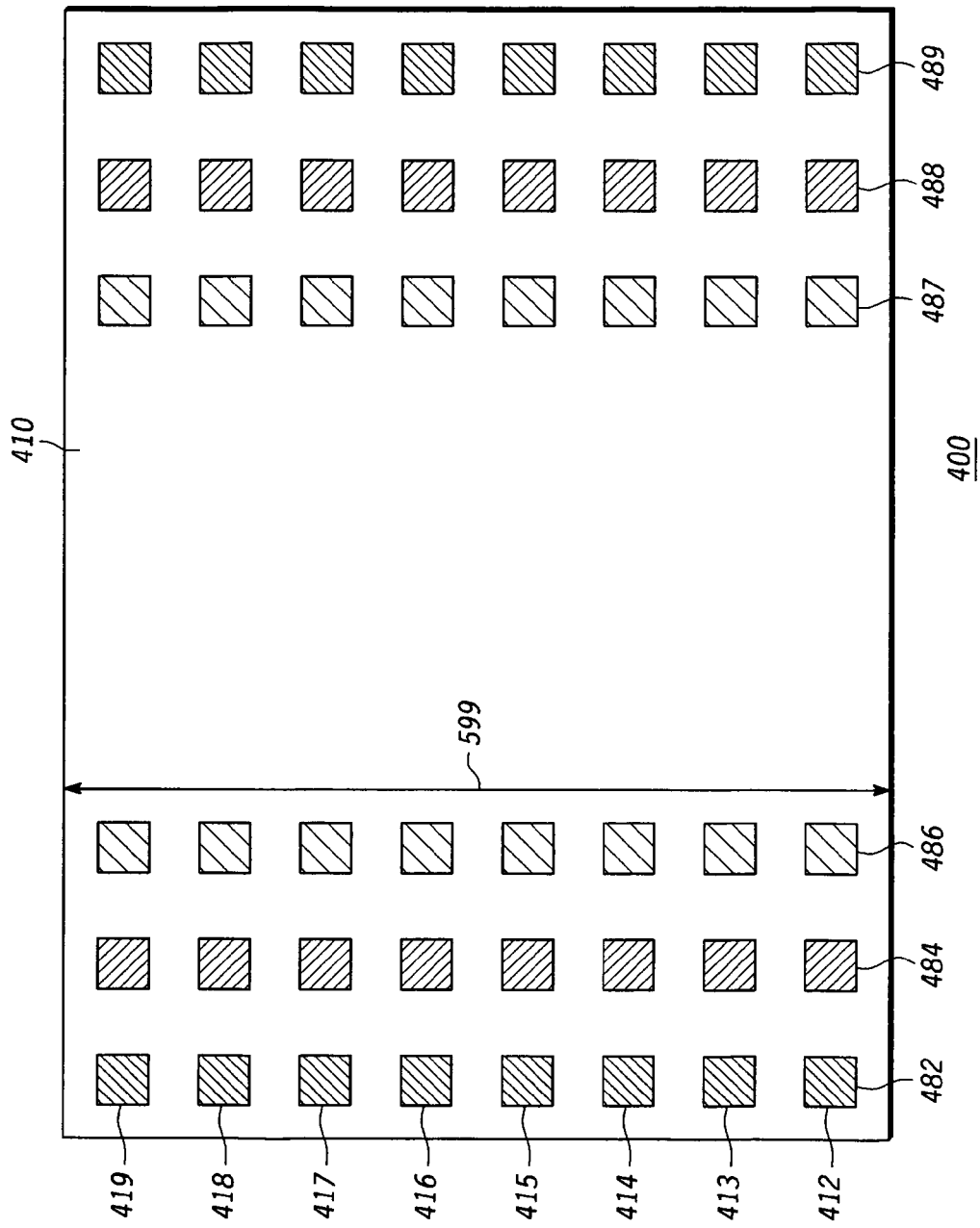
FIG. 5 illustrates a top view of the fourth electrical component of FIG. 4.

FIG. 4 illustrates a cross-sectional view of an electrical component 400 having an inductor 490 in accordance with a fourth embodiment of the present invention. FIG. 5 shows a top view of a portion of electrical component 400 of FIG. 4 as indicated by arrows 5 in FIG. 4. In this embodiment, electrical component 400 comprises multiple substrates with two electrical conductive layers coupled by multiple rows of vias.

Substrate 402 comprises a plurality of electrically conductive layers 408, 410, and 416 and rows of vias 484, 485, 486, 487, 488, 489, 490, 491, 492, 493, 494, and 495. Similarly, substrate 404 comprises an electrically conductive layer 432 and substrate 406 comprises electrically conductive layers 420 and vias 433, 434, 435, 436, 437, and 438. Electrical interconnections 470, 471, 472, 473, 474, and 475 are located between substrates 402 and 406, and electrical interconnections 476, 477 and 478 are located between substrates 402 and 404.

As an example, in FIGS. 4 and 5, electrically conductive layer 410 in substrate 402 is coupled to electrically conductive layer 408 by multiple rows of vias 484, 485, and 486. Row of vias 487, 488, and 489 electrically couple layer 410 to an electrically conductive layer 416.

The multiple rows of vias coupling the electrical conductive layers are not limited to coupling electrical conductive layers within a single substrate. Multiple rows of vias and multiple rows of electrical interconnections can be used to couple electrical conductive layers in different substrates.

As an example, layer 416 is electrically coupled to electrically conductive layer 420 by rows of vias 433, 434, 435, 490, 491, and 492 and also by rows of electrical interconnections 470, 471, and 472. Likewise, layer 420 is electrically coupled to electrically conductive layer 432 by rows of vias 436, 437, 438, 481, 482, 483, 493, 494, and 495 and also by rows of electrical interconnections 473, 474, 475, 476, 477, and 478.

Row 482 in FIG. 5 comprises vias 412, 413, 414, 415, 416, 417, 418, and 419. Likewise, each of the rows of vias 433-438 and 481-495 include one or more individual vias electrically coupling the electrically conductive layers. Unlike a planar spiral inductor, the vertical nature of inductor 490 permits horizontal width 599 to be set arbitrarily wide and, thus, achieve a very low resistance.

FIG. 6 illustrates a flow chart 500 for a method of forming an inductor in an electrical component according to an embodiment of the invention. Flow chart 500 includes a step 510 for providing one or more first substrates with one or more first electrically conductive layers. As an example, the first substrates of step 510 can be similar to substrate 102 in FIG. 1. Flow chart 500 in FIG. 6 continues with a step 520 of providing one or more second substrates comprising one or more second electrically conductive layers. As an example, the second substrates of step 520 can be similar to substrates 104 and 106 in FIG. 1.

Subsequently, flow chart 500 in FIG. 6 continues with a step 530 for electrically interconnecting the first electrically conductive layers and the second electrically conductive layers to form an inductor. As an example, the inductor formed in step 530 can be similar to inductor 190 in FIG. 1.

FIG. 7 illustrates a flow chart 600 for a method of manufacturing an inductor in an electrical component according to an embodiment of the invention. Flow chart 600 includes a step 610 for providing a semiconductor substrate. As an example, the semiconductor substrate of step 610 can be HDI, Si, GaAs, Ge or any other type of semiconductor substrate.

Flow chart 600 in FIG. 7 continues with a step 620 for forming a metal layer. As an example, a metal layer of step 620 can be formed by depositing, masking, and etching the metal layer on the semiconductor substrate. As an example, the metal layer of step 620 can be similar to layer 124 in FIG. 1.

Flow chart 600 in FIG. 7 continues with a step 630 for forming a dielectric layer over the metal layer. As an example, the dielectric layer of step 630 can be deposited on the metal layer. Subsequently, flow chart 600 in FIG. 7 continues with a step 640 for forming the plugs in the dielectric layer to electrically connect the metal layers. As an example, plugs of step 640 are formed by etching the dielectric material and by filling the plugs with an electrically conductive material.

Flow chart 600 continues at step 645 with a repetition of steps 620, 630, and 640 until the electrically conductive layers, dielectric layers, and plugs of the inductor in the first substrate are formed.

Subsequently, flow chart 600 in FIG. 7 continues with a step 650 for processing the second substrates. As an example, the second substrate of step 650 can be formed using steps similar to steps 610, 620, 630, 640, and 645, as described above for the first substrate.

Next, flow chart 600 in FIG. 7 proceeds with a step 660 for processing the third substrates. As an example, the third substrate of step 660 can be formed using the same steps 610-645 described above for the first substrate.

Finally, flow chart 600 in FIG. 7 continues with a step 670 for electrically coupling the metal layers to form an inductor. As an example, metal layers of the substrates can be electrically coupled using solder bumps, flip chip bumps, direct interconnect technology, or other means of interconnection.

The steps of FIG. 7 are a description of one method of constructing an inductor in accordance with the present invention. Other manufacturing steps or processes can be used to form the various layers of the semiconductor device. The details of the steps of depositing, etching, masking the metal layers, dielectric layers, and plugs are well known in the art, and the technical details of these methods are omitted.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that layers 102, 104, and 106 may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An electrical component comprising:
   a first substrate having a first electrical conductor, the first electrical conductor having a first end and a second end; and
   a second substrate having a second electrical conductor and a third electrical conductor, the second and third electrical conductors each having first and second ends;
   the first substrate and the second substrate stacked to form a multi-layer assembly, wherein the first electrical conductor, the second electrical conductor, and the third electrical conductor are positioned to be substantially parallel with each other and in a single plane, and wherein the first and second ends of the first, second, and third electrical conductors are selectively coupled together to form a single spiral inductor using the first, second, and third electrical conductors.

2. The electrical component of claim 1, wherein the first, second, and third electrical conductors are selectively coupled together using a plurality of vias.

3. The electrical component of claim 1, wherein, with respect to a predetermined perspective, the first ends are near ends and the second ends are far ends, wherein the first end of the first electrical conductor is electrically connected to the first end of the third electrical conductor, and wherein the second end of the first electrical conductor is electrically connected to the second end of the second electrical conductor.

4. The electrical component of claim 3, wherein an electrical connection for electrically connecting the first ends of the first and third electrical conductors comprises a plurality of vias.

5. The electrical component of claim 4, wherein the plurality of vias comprises a row of vias.

6. The electrical component of claim 4, wherein the plurality of vias comprises a plurality of rows of vias.

7. The electrical component of claim 1, further comprising a third substrate having a fourth electrical conductor, the third substrate stacked with the first and second substrates to form the multi-layer assembly.

8. The electrical component of claim 7, wherein the fourth electrical conductor is selectively coupled together with the first, second, and third electrical conductors to form the single spiral inductor.

9. The electrical component of claim 8, wherein the fourth electrical conductor has a first end and a second end, wherein the fourth electrical conductor is substantially parallel with the first, second, and third electrical conductors, and wherein the second end of the second electrical conductor is electrically coupled to the second end of the fourth electrical conductor.

10. The electrical component of claim 1, wherein each of the first and second substrates comprises one of a semiconductor substrate, a high density interconnect substrate, or a printed circuit board.

* * * * *